United States Patent
Wang et al.

(10) Patent No.: US 12,518,961 B2
(45) Date of Patent: Jan. 6, 2026

(54) WAFER BACKSIDE CLEANING METHOD

(71) Applicant: ACM RESEARCH (SHANGHAI), INC., Shanghai (CN)

(72) Inventors: Hui Wang, Shanghai (CN); Zhenming Chu, Shanghai (CN); Zeran Li, Shanghai (CN); Xiaoyan Zhang, Shanghai (CN); Deyun Wang, Shanghai (CN); Fuping Chen, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 32 days.

(21) Appl. No.: 18/720,398

(22) PCT Filed: Nov. 24, 2022

(86) PCT No.: PCT/CN2022/133991
§ 371 (c)(1),
(2) Date: Jun. 14, 2024

(87) PCT Pub. No.: WO2023/109455
PCT Pub. Date: Jun. 22, 2023

(65) Prior Publication Data
US 2025/0046598 A1      Feb. 6, 2025

(30) Foreign Application Priority Data

Dec. 14, 2021   (CN) .......................... 202111531177.0

(51) Int. Cl.
*H01L 21/02*      (2006.01)
*H01L 21/683*     (2006.01)

(52) U.S. Cl.
CPC ...... *H01L 21/0209* (2013.01); *H01L 21/6838* (2013.01)

(58) Field of Classification Search
CPC .................................................. H01L 21/0209
See application file for complete search history.

(56) References Cited

U.S. PATENT DOCUMENTS

2006/0252000 A1* 11/2006 Hayashi ............... F27D 5/0037
                                                          392/416

FOREIGN PATENT DOCUMENTS

| CN | 1351368 A | 5/2002 |
|---|---|---|
| CN | 102376532 A | 3/2012 |

(Continued)

OTHER PUBLICATIONS

Machine Translation of TW 201248703A (Year: 2012).*

(Continued)

*Primary Examiner* — Sharidan Carrillo
(74) *Attorney, Agent, or Firm* — Osha Bergman Watanabe & Burton LLP

(57) ABSTRACT

Disclosed is a wafer backside cleaning method, comprising: using a wafer clamping part to hold a wafer, a gap being formed between the wafer clamping part and the wafer; injecting a protective gas into the gap at a first flow rate; adjusting the flow rate of the protective gas from the first flow rate to a second flow rate, and rotating the wafer under the drive of the first rotational speed of the wafer clamping part to clean the backside of the wafer; adjusting the rotational speed of the wafer clamping part from the first rotational speed to a second rotational speed, so that the wafer is driven by the wafer clamping part to rotate for the drying process; stopping rotating the wafer, adjusting the flow rate of the protective gas to the first flow rate again from the second flow rate, and then taking out the wafer; and stopping injecting the protective gas after the wafer is taken out. According to the present invention, adjusting the switching logic and flow rate of the protective gas can ensure that the front side of the wafer is not prone to adsorption of external impurities during a wafer backside cleaning process, thereby improving the wafer backside cleaning stability.

10 Claims, 5 Drawing Sheets

(56) References Cited

FOREIGN PATENT DOCUMENTS

| | | | |
|---|---|---|---|
| CN | 104813460 A | 7/2015 | |
| CN | 108701609 A | 10/2018 | |
| CN | 112447571 A | 10/2018 | |
| JP | H0864568 A | 3/1996 | |
| JP | 2004319720 A | 11/2004 | |
| TW | 201248703 A * | 12/2012 | ....... H01L 21/68785 |
| WO | WO-2005081283 A2 * | 9/2005 | ....... H01L 21/68735 |

OTHER PUBLICATIONS

International Search Report issued in Application No. PCT/CN2022/133991, mailed on Jan. 18, 2023 (6 pages).
Written Opinion issued in Application No. PCT/CN2022/133991, mailed on Jan. 18, 2023 (3 pages).

* cited by examiner

WAFER BACKSIDE CLEANING METHOD

BACKGROUND OF THE INVENTION

1. Field of the Invention

The present invention generally relates to the technical field of semiconductor device fabrication, and more particularly to a wafer backside cleaning method.

2. The Related Art

During the semiconductor device fabrication process, the processes used for manufacturing semiconductor devices mainly include cleaning, etching, coating or removing of photoresist, etc. These processes are mainly for the front side (device side) of wafer. However, the wafer backside (non-device side) processing is equally important.

In the semiconductor cleaning process, most single wafer cleaning machines are used for wafer cleaning, which mainly involves the front side (device side) of the wafer cleaning process and the backside (non-device side) of the wafer cleaning process. During a wafer backside cleaning process, the front side of wafer is likely to be contaminated with contaminants, which would induce the semiconductor device electrical failure. Therefore, in order to ensure the quality of semiconductor devices, it is essential to protect the front side of the wafer.

Specifically, during the wafer backside cleaning process, a single-piece wafer is placed on a wafer clamping table of a single wafer cleaning machine. Even though there are various clamping methods, there is a certain gap between the wafer clamping table and the wafer. The wafer rotates at a high speed during the drying process of the backside cleaning process, creating a negative pressure zone between the wafer and the wafer clamping table. The negative pressure inside the gap will absorb the external impurities to the front side of wafer, resulting in the front side of wafer being contaminated. Therefore, the wafer backside cleaning process of the single wafer cleaning machine is subject to the structure of the single wafer cleaning machine, and the front side of the wafer needs to be protected to avoid the front side of the wafer being contaminated when the backside cleaning process is finished and drying process is performed. During the drying process at the end of the wafer backside cleaning process, it is necessary to provide a certain level of protection to the front side of wafer to avoid contamination.

Currently, there are various methods for protecting the front side of wafer, including $N_2$ protection and water protection. Wherein, the most commonly used protection method is $N_2$. However, traditional $N_2$ protection can lead to impurities adsorbing on the front side of wafer during the process of operation, significantly affecting the protection effect of the front side of wafer.

Therefore, it is necessary to propose a wafer backside cleaning method applied to single wafer cleaning machine to improve the protection effect.

SUMMARY

In view of the above-mentioned shortcomings of the prior art, the purpose of the present invention is to provide a wafer backside cleaning method, aiming to solve the problem that the front side (device side) of the wafer is easily polluted during the wafer backside cleaning process by a traditional wafer cleaning machine. To solve the problem, by adjusting the switch logic and flow rate of the protective gas, it avoids the negative pressure on the front side of wafer being enhanced by the high-speed rotation of the wafer during the cleaning and drying process, which is easy to adsorb external impurities, and ensures that the front side of wafer is not easy to be adsorbed by external impurities during a wafer backside cleaning process, thereby improving the wafer backside cleaning stability.

To achieve the above and other related purposes, the present invention provides a wafer backside cleaning method, comprising the following steps:

step S1, using a wafer clamping part to hold the wafer so that the backside of the wafer faces up and the front side of the wafer faces down, a gap being formed between the wafer clamping part and the front side of the wafer, the rotational speed of the wafer clamping part being 0 rpm;

step S2, injecting a protective gas into the gap at a first flow rate to fill the gap with the protective gas;

step S3, gradually adjusting the flow rate of the protective gas from the first flow rate to a second flow rate, starting to rotate the wafer clamping part to drive the wafer to rotate and the rotational speed of the wafer clamping part reaching a first rotational speed, spraying cleaning liquid to the backside of the wafer for the backside cleaning process;

step S4, adjusting the rotational speed of the wafer clamping part from the first rotational speed to a second rotational speed, so that the wafer is driven by the wafer clamping part to rotate for the drying process;

step S5, after the drying process is completed, adjusting the wafer clamping part from the second rotational speed to 0 rpm to stop the wafer rotating, adjusting the flow rate of the protective gas to the first flow rate again from the second flow rate, and then taking the dried wafer from the wafer clamping part;

step S6, stopping injecting the protective gas after the wafer is taken out.

According to an embodiment of the invention, the wafer clamping part is a mechanical clamping table, which directly acts on the wafer to clamp the wafer.

According to an embodiment of the invention, the mechanical clamping table is provided with a first through-hole through which the protective gas is injected into the interior of the gap.

According to an embodiment of the invention, the protective gas is inert gas.

According to an embodiment of the invention, the wafer clamping part is a Bernoulli clamping table. The Bernoulli clamping table is provided with second through-holes through which Bernoulli gas is injected to keep a floating state of the wafer.

According to an embodiment of the invention, the Bernoulli clamping table is provided with third through-holes through which protective gas is injected into the gap.

According to an embodiment of the invention, the first flow rate is greater than the second flow rate.

According to an embodiment of the invention, the second rotational speed is greater than the first rotational speed.

According to an embodiment of the invention, the first rotational speed is 300 rpm-1200 rpm.

According to an embodiment of the invention, the second rotational speed is 1500 rpm-4000 rpm.

The invention solves the problem that the front side (device side) of wafer is easily polluted during the wafer backside cleaning process by traditional wafer cleaning machine. By adjusting the switch logic and flow rate of the protective gas, it ensures that the front side of wafer is not easily adsorbed by external impurities during the wafer backside cleaning process, and improves the stability of the wafer backside cleaning.

DETAILED DESCRIPTION OF EMBODIMENTS

The following illustrates the embodiment of the invention by means of particular specific examples, and other advantages and effects of the invention can be readily understood by those skilled in the art from the contents disclosed in this specification. The invention may also be implemented or applied in various other specific embodiments, and various details in this specification may be modified or changed based on different views and applications without departing from the spirit of the invention.

Referring to FIGS. 1 to 5, it should be noted that the diagrams provided by this embodiment are only schematically illustrate the basic concept of the invention. Although only components related to the invention are shown in the diagrams rather than being drawn according to the number, shape, and size of components in actual implementation, the shape, quantity, and proportion of each component can be changed arbitrarily during actual implementation, and the layout of the components may be more complex.

Embodiment 1

Figure 1:
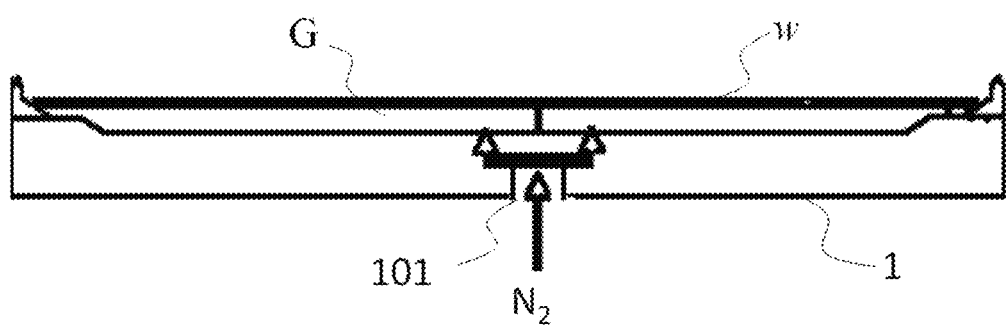
FIG. 1 is a schematic structural view of a wafer clamped by a mechanical clamping table provided in embodiment 1 of the invention.
Figure 2:
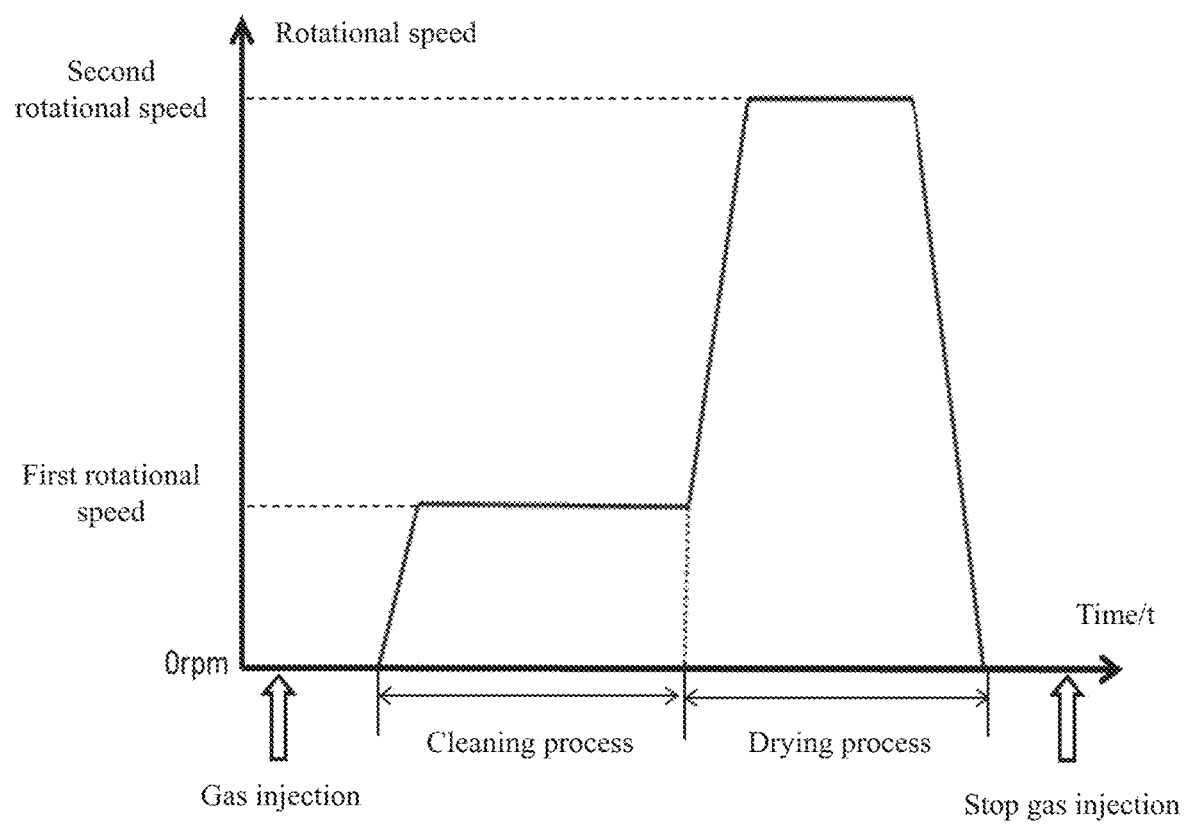
FIG. 2 is a schematic view of the rotational speed adjustment of a wafer clamping part provided by the invention.
Figure 3:
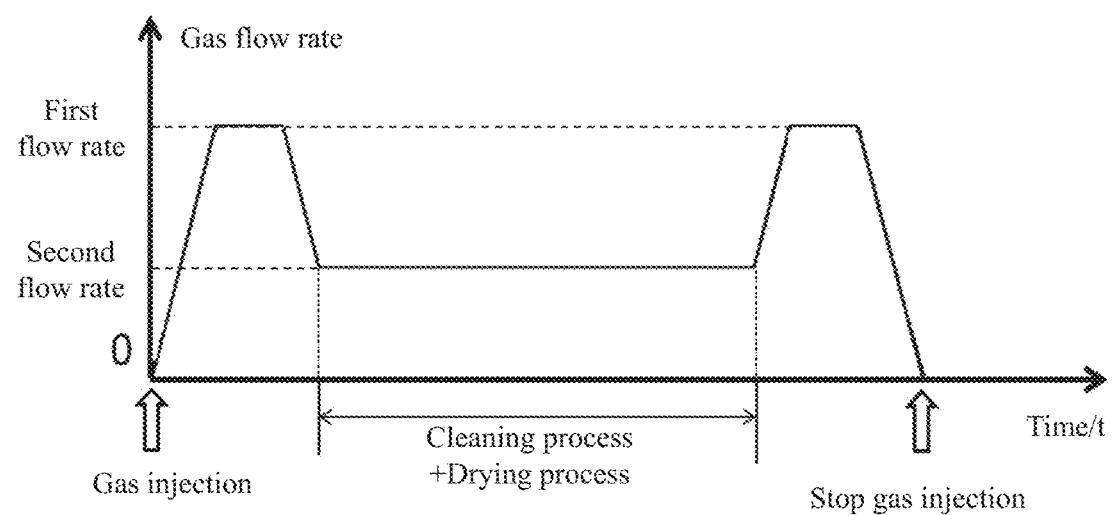
FIG. 3 is a schematic view of the flow rate adjustment of the protection gas $N_2$ provided by embodiment 1 of the invention.

Referring to FIGS. 1 to 3, embodiment 1 provides a wafer backside cleaning method in which a wafer w is placed on a wafer clamping part during a wafer backside cleaning process. As shown in FIG. 1, the wafer clamping part is a mechanical clamping table 1, which directly acts on the wafer w to clamp the wafer w, so that the backside (non-device side) of the wafer w faces up and the front side (device side) of the wafer w faces down, and a gap G is formed between the wafer w and the mechanical clamping table 1. A first through-hole 101 is provided at the center of the mechanical clamping table 1, which is used to inject a protective gas into the gap G, so as to realize the protection of the front side (device side) of the wafer w during the wafer backside cleaning process. The protective gas is an inert gas, among which the inert gas includes: $N_2$ or helium, neon and other rare gases.

As shown in FIGS. 2 and 3, the wafer backside cleaning method includes the following steps:

Step S1, the manipulator places the wafer w to be cleaned on the mechanical clamping table 1 in a stationary state. The mechanical clamping table 1 clamps the wafer w so that the backside (non-device side) of the wafer w faces up and the front side (device side) of the wafer w faces down. Wherein, as shown in FIG. 2, the rotational speed of the mechanical clamping table 1 in the stationary state is 0 rpm.

Step S2, as shown in FIG. 3, the protective gas is injected into the interior of the gap G between the wafer w and the mechanical clamping table 1 via the first through-hole 101 in accordance with the first flow rate, so that the interior of the gap G is rapidly filled with the protective gas. That is, when the backside (non-device side) of the wafer w in the cleaning process, the front side (device side) of the wafer w is in the protective gas all the time to protect the front side of the wafer w. In this embodiment 1, the protective gas is $N_2$.

Step S3, after the gap G is filled with protective gas, the flow rate of the protective gas through the first through-hole 101 is gradually adjusted from the first flow rate to the second flow rate, and the mechanical clamping table 1 starts to rotate and the rotational speed reaches the first rotational speed. Wafer w is rotated by the first rotational speed of the mechanical clamping table 1, at which time a cleaning liquid is sprayed onto the backside (non-device side) of the wafer w to clean wafer w backside.

As shown in FIG. 3, the first flow rate of the $N_2$ is greater than the second flow rate. In this embodiment 1, the first flow rate is 200 L and the second flow rate is 50 L.

Wherein, in this embodiment 1, before the wafer w is cleaned, protective gas $N_2$ with a relatively large flow rate is used to quickly fill the interior of the gap G between the front side of the wafer w and the mechanical clamping table 1.

Step S4, as shown in FIG. 2, a rotational speed of the mechanical clamping table 1 is adjusted from the first rotational speed to the second rotational speed, and the wafer w is rotated under the second rotational speed of the mechanical clamping table 1 to dry wafer w. The first rotational speed is less than the second rotational speed.

Wherein, the first rotational speed of the mechanical clamping table 1 is 300 rpm-1200 rpm; the second rotational speed of the mechanical clamping table 1 is 1500 rpm-4000 rpm. In embodiment 1, the first rotational speed is 500 rpm, and the second rotational speed is 2000 rpm.

Step S5, after the wafer w is dried, the mechanical clamping table 1 is adjusted from the second rotational speed to a static state. That is, as shown in FIG. 2, a rotational speed of the mechanical clamping table 1 is gradually reduced from 2000 rpm to 0 rpm, so that the rotation of the high-speed rotating the wafer w gradually stops. As shown in FIG. 3, a flow rate of the protective gas $N_2$ is adjusted from the second flow rate to the first flow rate again. Then, the manipulator takes the dried wafer w from the mechanical clamping table 1.

Wherein, in this embodiment 1, before the manipulator takes the wafer w, a flow rate of the protective gas $N_2$ is increased from the second flow rate to the first flow rate again. The purpose is to quickly dry the cleaning liquid remaining at the edge of the wafer w by increasing the gas flow rate, so as to avoid polluting the front side (device side) of the wafer w with the cleaning liquid remaining at the edge of the wafer w during the subsequent taking the wafer w by the manipulator.

Step S6, as shown in FIG. 3, after the wafer w is taken out, turn off the protective gas $N_2$ to stop injecting protective gas $N_2$ into the gap G between the mechanical clamping table 1 and the wafer w.

Wherein, during the entire cleaning and drying process of the wafer w, the protective gas $N_2$ is filled with the front side (device side) of the wafer w. This can avoid the negative pressure on the front side of the wafer w being enhanced by the high-speed rotation of the wafer during the cleaning and drying process, which is easy to adsorb external impurities, thus achieving the protection of the front side of wafer w.

Embodiment 2

Figure 4:
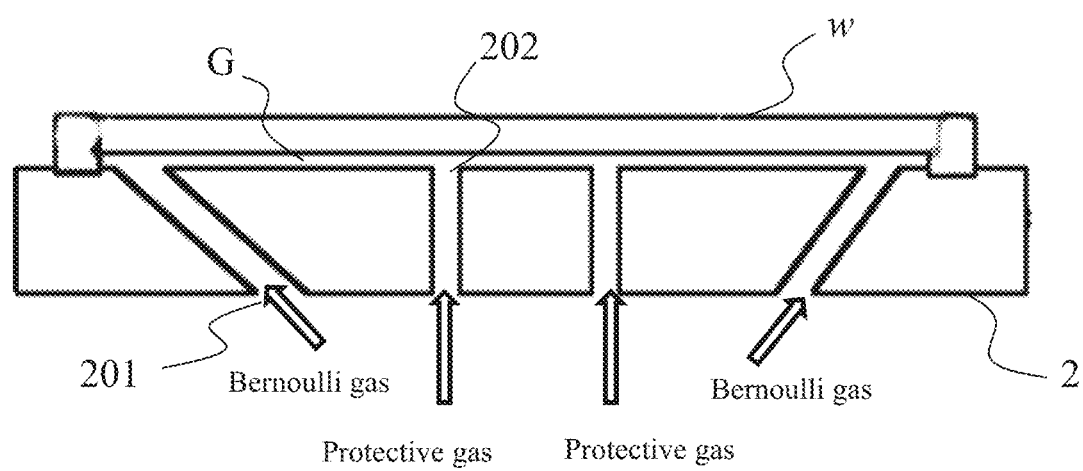
FIG. 4 is a schematic structural view of a wafer clamped by a Bernoulli clamping table provided by embodiment 2 of the invention.
Figure 5:
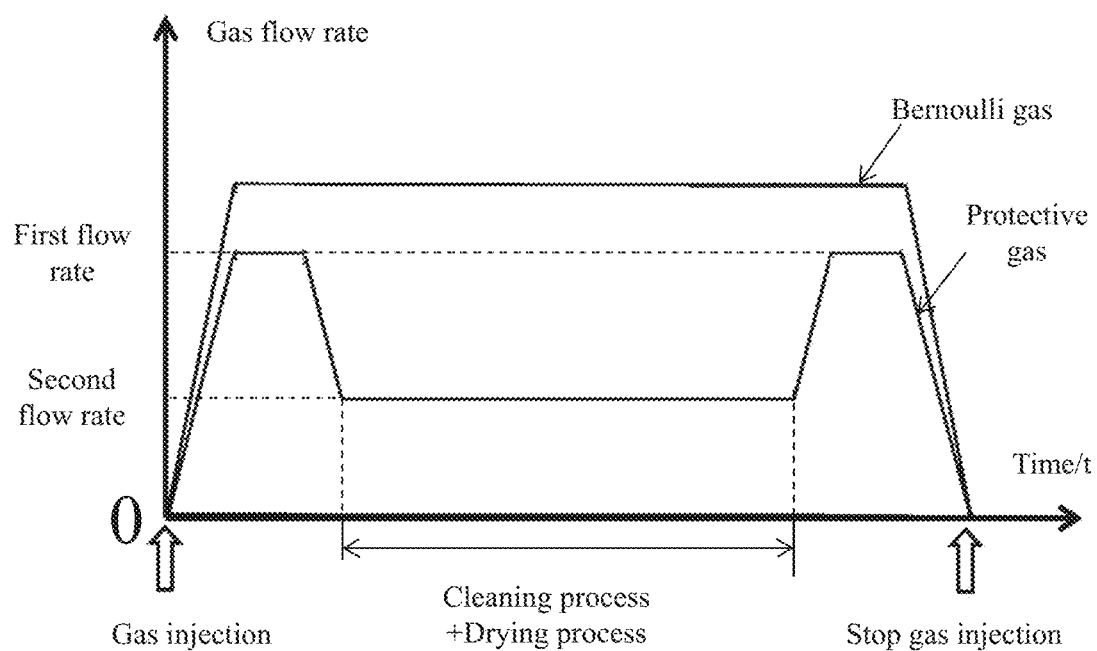
FIG. 5 is a schematic view of the flow rate adjustment of Bernoulli $N_2$ and lift $N_2$ provided by embodiment 2 of the invention.

Referring to FIGS. 2, 4, and 5, this embodiment 2 also provides a wafer backside cleaning method in which wafer w is placed on a wafer clamping part during a wafer backside cleaning process. As shown in FIG. 4, the wafer clamping part is a Bernoulli clamping table 2, which suspends and holds the wafer w, so that the backside (non-device side) of the wafer w faces up, the front side (device side) of the wafer w faces down, and a gap G is formed between the suspended wafer w and the Bernoulli clamping table 2. Second through-holes 201 are provided at the periphery of the Bernoulli clamping table 2, which is used to inject a Bernoulli gas to the front side of the wafer w, so as to keep a floating state of the wafer w by the Bernoulli clamping table 2. Third through-holes 202 are provided at the middle of the Bernoulli clamping table 2, which is used to inject a protective gas into the gap G between the suspended wafer w and the Bernoulli clamping table 2, so as to protect the front side of the wafer w, but also to adjust the height of the wafer w suspension during a wafer backside cleaning process.

Wherein, in embodiment 2, both the Bernoulli gas and the protective gas are $N_2$, or inert gases, such as helium, neon and other rare gases.

As shown in FIGS. 2 and 5, a wafer backside cleaning method includes the following steps:

Step S1, as shown in FIG. 4, the manipulator places the wafer w to be cleaned on the Bernoulli clamping table 2 in a stationary state, and supply the Bernoulli gas into the second through-holes 201. The Bernoulli clamping table 2 clamps the wafer w so that the backside (non-device side) of the wafer w faces up and the front side (device side) of the wafer w faces down. Wherein, as shown in FIG. 2, a rotational speed of the Bernoulli clamping table 2 in the stationary state is 0 rpm.

Step S2, as shown in FIG. 5, the protective gas is injected into the interior of the gap G between the suspended wafer w and the Bernoulli clamping table 2 by the third through-holes 202 in accordance with the first flow rate, so that the interior of the gap G is rapidly filled with the protective gas. That is, when the backside of the suspended wafer w in the cleaning process, the front side (device side) of the wafer w is in the $N_2$ atmosphere all the time to protect the front side of the wafer w.

Step S3, after the gap G is filled with protective gas, the flow rate of the protective gas through the third through-holes 202 is gradually adjusted from the first flow rate to the second flow rate, and the Bernoulli clamping table 2 starts to rotate and the rotational speed reaches the first rotational speed. The suspended wafer w is rotated by the first rotational speed of the Bernoulli clamping table 2, at which time a cleaning liquid is sprayed onto the backside (non-device side) of the wafer w to clean the wafer w backside.

As shown in FIG. 5, the first flow rate of the protective gas is greater than the second flow rate. In this embodiment 2, the first flow rate is 200 L and the second flow rate is 50 L.

Wherein, in this embodiment 2, before the wafer w is cleaned, protective gas $N_2$ with a relatively large flow rate (the first flow rate) is used to quickly fill the gap G between the suspended wafer w and the Bernoulli clamping table 2.

During wafer w cleaning and drying process, the flow rate of the protective gas $N_2$ is reduced (from the first flow rate to the second flow rate) in order to avoid the excessive flow rate of $N_2$ affecting the height adjustment of the suspended wafer w by the Bernoulli clamping table 2.

Step S4, as shown in FIG. 2, a rotational speed of the Bernoulli clamping table 2 is adjusted from the first rotational speed to the second rotational speed, and the wafer w is rotated under the second rotational speed of the Bernoulli clamping table 2 to dry the wafer w. The first rotational speed is less than the second rotational speed.

Wherein, as shown in FIG. 2, the rotational speed of the Bernoulli clamping table 2 in the wafer w drying process greater than that of in the wafer w cleaning process. The reason is that the drying process of the wafer w needs to increase the rotational speed of Bernoulli clamping table 2 so as to quickly dry the cleaning liquid on the surface of the wafer w.

Wherein, the first rotational speed of the Bernoulli clamping table 2 is 300 rpm-1200 rpm; the second rotational speed of the Bernoulli clamping table 2 is 1500 rpm-4000 rpm. In embodiment 2, the first rotational speed is 500 rpm, and the second rotational speed is 2000 rpm.

Step S5, after the suspended wafer w is dried, the Bernoulli clamping table 2 is adjusted from the second rotational speed to a static state. That is, as shown in FIG. 2, a rotational speed of the Bernoulli clamping table 2 is gradually reduced from 2000 rpm to 0 rpm, so that the rotation of the high-speed rotating wafer w gradually stops. As shown in FIG. 5, a flow rate of the protective gas is adjusted from the second flow rate to the first flow rate again. Then, the manipulator takes the dried wafer w from the Bernoulli clamping table 2.

Wherein, in this embodiment 2, since the gap G between the suspended wafer w and the Bernoulli clamping table 2 is small, the front side (device side) of the wafer w is easily destroyed when the manipulator takes the wafer w from the Bernoulli clamping table 2. Therefore, before the manipulator takes the wafer w, the flow rate of the protective gas $N_2$ is increased again from the second flow rate to the first flow rate, which is used to increase the height of the gap G between the suspended wafer w and the Bernoulli clamping table 2, so as to facilitate the manipulator to taking the wafer w smoothly.

Step S6, as shown in FIG. 5, after the wafer w is taken out, turn off the Bernoulli gas and at the same time turn off the protective gas.

In the invention, during the entire cleaning and drying process of wafer w, the protective gas $N_2$ is filled with the front side (device side) of the wafer w, so as to avoid the negative pressure on the front side of the wafer w being enhanced by the high-speed rotation of the wafer w during the cleaning and drying process, which is easy to adsorb external impurities, thus achieving the protection of the front side of the wafer w.

Although the contents of the invention have been described in detail by the above preferred embodiments, it should be recognized that the above description should not be considered a limitation of the invention. Various modifications and substitutions that may be apparent to those skilled in the art are intended to be included within the scope of the protection of this invention as defined by the accompanying claims.

What is claimed is:

1. A wafer backside cleaning method, comprising:

step S1, using a wafer clamping part to hold a wafer so that a backside of the wafer faces up and a front side of the wafer faces down, a gap being formed between the wafer clamping part and the front side of the wafer, a rotational speed of the wafer clamping part being 0 rpm;

step S2, injecting a protective gas into the gap at a first flow rate to fill the gap with the protective gas;

step S3, gradually adjusting the flow rate of the protective gas from the first flow rate to a second flow rate, starting to rotate the wafer clamping part to drive the wafer to rotate and the rotational speed of the wafer clamping part reaching a first rotational speed, and spraying cleaning liquid to the backside of the wafer for a backside cleaning process;

step S4, adjusting the rotational speed of the wafer clamping part from the first rotational speed to a second rotational speed, so that the wafer is driven by the wafer clamping part to rotate for a drying process;

step S5, after the drying process is completed, adjusting the wafer clamping part from the second rotational speed to 0 rpm to stop the wafer from rotating, adjusting the flow rate of the protective gas to the first flow rate from the second flow rate, and then taking the dried wafer out from the wafer clamping part; and step S6, stopping injecting of the protective gas after the wafer is taken out from the wafer clamping part.

2. The wafer backside cleaning method as claimed in claim 1, wherein the wafer clamping part is a mechanical clamping table, which directly acts on the wafer to hold the wafer.

3. The wafer backside cleaning method as claimed in claim 1, wherein the protective gas is an inert gas.

4. The wafer backside cleaning method as claimed in claim 1, wherein the wafer clamping part is a Bernoulli clamping table, and second through-holes are provided on the Bernoulli clamping table, which are used to inject a Bernoulli gas to keep a floating state of the wafer.

5. The wafer backside cleaning method as claimed in claim 1, wherein the first flow rate is greater than the second flow rate.

6. The wafer backside cleaning method as claimed in claim 1, wherein the second rotational speed is greater than the first rotational speed.

7. The wafer backside cleaning method as claimed in claim 1, wherein the first rotational speed is 300 rpm-1200 rpm.

8. The wafer backside cleaning method as claimed in claim 1, wherein the second rotational speed is 1500 rpm-4000 rpm.

9. The wafer backside cleaning method as claimed in claim 2, wherein a first through-hole is provided on the mechanical clamping table, which is used to inject the protective gas into the gap.

10. The wafer backside cleaning method as claimed in claim 4, wherein third through-holes are provided on the Bernoulli clamping table, which are used to inject the protective gas into the gap.

* * * * *